United States Patent
Kolics

(10) Patent No.: US 9,368,340 B2
(45) Date of Patent: Jun. 14, 2016

(54) METALLIZATION OF THE WAFER EDGE FOR OPTIMIZED ELECTROPLATING PERFORMANCE ON RESISTIVE SUBSTRATES

(71) Applicant: Lam Research Corporation, Fremont, CA (US)

(72) Inventor: Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/294,006

(22) Filed: Jun. 2, 2014

(65) Prior Publication Data

US 2015/0348772 A1    Dec. 3, 2015

(51) Int. Cl.
*H01L 21/00* (2006.01)
*H01L 21/02* (2006.01)
*C25D 5/02* (2006.01)
*C25D 7/00* (2006.01)
*C23C 18/16* (2006.01)
*H01L 21/3205* (2006.01)
*H01L 21/321* (2006.01)

(52) U.S. Cl.
CPC ........ *H01L 21/02021* (2013.01); *C23C 18/161* (2013.01); *C23C 18/163* (2013.01); *C25D 5/02* (2013.01); *C25D 7/00* (2013.01); *H01L 21/3212* (2013.01); *H01L 21/32051* (2013.01)

(58) Field of Classification Search
CPC .................. H01L 21/02021; H01L 21/32051; H01L 21/3212; C23C 18/161; C23C 18/163; C25D 5/02; C25D 7/00
USPC ............................................ 438/95; 257/786
See application file for complete search history.

(56) References Cited

U.S. PATENT DOCUMENTS

| | | | | |
|---|---|---|---|---|
| 5,516,412 A | * | 5/1996 | Andricacos | C25D 17/00 204/224 M |
| 5,973,405 A | * | 10/1999 | Keukelaar | G01R 1/06761 257/48 |
| 6,040,702 A | * | 3/2000 | Hembree | G01R 1/0483 324/750.19 |
| 6,144,103 A | * | 11/2000 | Miller | H01L 23/556 257/772 |
| 6,313,651 B1 | * | 11/2001 | Hembree | G01R 1/0483 324/756.02 |
| 6,492,269 B1 | | 12/2002 | Liu et al. | |
| 6,774,039 B1 | | 8/2004 | Drewery | |
| 6,811,670 B2 | | 11/2004 | Liu et al. | |

(Continued)

FOREIGN PATENT DOCUMENTS

JP    58176969 A  * 10/1983

*Primary Examiner* — Caleb Henry
(74) *Attorney, Agent, or Firm* — Martine Penilla Group, LLP

(57) ABSTRACT

A method for electroplating a substrate is provided, including: providing a substrate having a conductive layer disposed on a top surface of the substrate, the top surface of the substrate having an edge exclusion region and a process region; directing a flow of an electroless deposition solution toward the edge exclusion region while the substrate is rotated, to plate metallic material over the conductive layer at the edge exclusion region; continuing the flow of the electroless deposition solution for a period of time to produce an increased thickness of the metallic material at the edge exclusion region, wherein the increased thickness of the metallic material reduces electrical resistance of the metallic material at the edge exclusion region; applying electrical contacts over the metallic material, and applying electrical current to the metallic material via the electrical contacts while an electroplating solution is applied over the process region of the substrate.

19 Claims, 14 Drawing Sheets

(56) References Cited

U.S. PATENT DOCUMENTS

| | | | | |
|---|---|---|---|---|
| 7,012,333 B2 * | 3/2006 | Shimoyama | C25D 3/60 | 257/737 |
| 7,211,504 B2 | 5/2007 | Uhlendorf | | |
| 7,232,513 B1 * | 6/2007 | Webb | C25D 3/38 | 205/123 |
| 7,244,665 B2 | 7/2007 | Benson | | |
| 7,384,531 B1 * | 6/2008 | Peltoma | C25D 5/024 | 205/118 |
| 7,416,975 B2 | 8/2008 | Uzoh et al. | | |
| 7,704,880 B1 | 4/2010 | Uzoh et al. | | |
| 8,048,775 B2 | 11/2011 | Feng et al. | | |
| 8,172,992 B2 | 5/2012 | Prabhakar et al. | | |
| 8,193,636 B2 * | 6/2012 | Lee | H01L 23/3107 | 257/690 |
| 8,308,931 B2 | 11/2012 | Reid et al. | | |
| 8,383,949 B2 | 2/2013 | Mohammed et al. | | |
| 8,518,224 B2 | 8/2013 | Ma et al. | | |
| 8,883,550 B2 * | 11/2014 | Fujdala | H01L 31/022425 | 136/262 |
| 8,895,651 B2 * | 11/2014 | Hermes | C25D 5/02 | 524/356 |
| 8,906,446 B2 * | 12/2014 | Ivanov | C23C 18/1628 | 427/437 |
| 2004/0253804 A1 * | 12/2004 | Beica | C25D 3/60 | 438/614 |
| 2005/0155706 A1 * | 7/2005 | Nishida | H01L 21/563 | 156/312 |
| 2005/0224974 A1 * | 10/2005 | Nishida | H01L 21/563 | 257/737 |
| 2007/0013067 A1 * | 1/2007 | Nishida | H01L 21/563 | 257/737 |
| 2007/0037377 A1 * | 2/2007 | Richardson | C25D 3/60 | 438/613 |
| 2008/0090079 A1 * | 4/2008 | Fajardo | B82Y 25/00 | 428/402 |
| 2008/0230896 A1 * | 9/2008 | Zhong | H01L 24/11 | 257/737 |
| 2009/0128417 A1 * | 5/2009 | Oberle | C23C 18/1608 | 343/700 MS |
| 2009/0301893 A1 * | 12/2009 | Cohen | C25D 1/00 | 205/131 |
| 2010/0132876 A1 * | 6/2010 | Kang | B32B 37/02 | 156/151 |
| 2010/0216302 A1 * | 8/2010 | Luo | C25D 3/60 | 438/613 |
| 2011/0031113 A1 * | 2/2011 | Lopatin | C25D 5/022 | 204/252 |
| 2011/0159211 A1 | 6/2011 | Du Bois et al. | | |
| 2011/0233745 A1 * | 9/2011 | Fee | H01L 24/10 | 257/673 |
| 2011/0266669 A1 * | 11/2011 | Chou | H01L 23/5329 | 257/737 |
| 2012/0032338 A1 * | 2/2012 | Komori | H01L 24/11 | 257/773 |
| 2012/0325671 A2 * | 2/2012 | Dai | C25D 5/02 | 205/118 |
| 2012/0138471 A1 * | 6/2012 | Mayer | C25D 21/12 | 205/170 |
| 2012/0151764 A1 * | 6/2012 | Furuta | H01L 21/4846 | 29/847 |
| 2012/0228681 A1 * | 9/2012 | Lin | H01L 27/14618 | 257/290 |
| 2013/0206602 A1 * | 8/2013 | Lee | C25D 3/56 | 205/253 |
| 2013/0256145 A1 * | 10/2013 | Romer | C25D 3/60 | 205/253 |
| 2013/0273740 A1 | 10/2013 | Chang | | |
| 2015/0315720 A1 * | 11/2015 | Mayer | C25D 5/02 | 204/241 |

* cited by examiner

METALLIZATION OF THE WAFER EDGE FOR OPTIMIZED ELECTROPLATING PERFORMANCE ON RESISTIVE SUBSTRATES

FIELD OF THE INVENTION

The present invention relates generally to semiconductor fabrication, and more particularly, to wafer edge metallization for optimized electroplating performance on resistive substrates.

DESCRIPTION OF THE RELATED ART

As technology nodes within the semiconductor industry have advanced it has become increasingly necessary to plate on highly resistive substrates. This is due in part to the thinning of the physical vapor deposition (PVD) seed layer with each successive technology node. For example, a 5 nm copper seed layer which may be used for 10 nm technologies exhibits a sheet resistance in the range of about 15 Ohms/square. This is significantly less more than that of a more conventional 100 nm copper seed which may have a sheet resistance in the range of about 0.2 Ohms/Square.

In even more extreme cases, the PVD copper seed may be eliminated and the electroplating is performed directly on a barrier/liner stack that is typically significantly more resistive than the conventional combination of a barrier, liner, and seed layer. The sheet resistance of the barrier/liner stack alone is often in the range of 100 to 1000 Ohms/Square.

Though efforts have been made to overcome plating current variability due to large terminal effects during electroplating on highly resistive substrates through chemical and hardware advances, these solutions do not address the difficulty in making electrical contact to very thin metal films.

It is in this context that embodiments of the invention arise.

SUMMARY

Disclosed are methods and systems for wafer edge metallization for optimized electroplating performance on resistive substrates.

In one embodiment, a method for electroplating a substrate is provided, including: providing a substrate having a conductive layer disposed on a top surface of the substrate, the top surface of the substrate having an edge exclusion region defined as an annular area that extends to an edge of the substrate, the top surface of the substrate further having a process region defined as a central area of the substrate that extends to about the annular area; directing a flow of an electroless deposition solution toward the edge exclusion region while the substrate is rotated, the flow being directed away from the process region, such that the electroless deposition solution is substantially directed over the annular area of the edge exclusion region, the electroless deposition solution plates metallic material over the conductive layer at the edge exclusion region; continuing the flow of the electroless deposition solution for a period of time, the period of time being predefined to produce an increased thickness of the metallic material at the edge exclusion region, wherein the increased thickness of the metallic material reduces electrical resistance of the metallic material at the edge exclusion region; applying electrical contacts over the metallic material, the electrical contacts being distributed around the annular area of the edge exclusion region; and applying electrical current to the metallic material via the electrical contacts while an electroplating solution is applied over the process region of the substrate, the increased thickness and resulting reduced electrical resistance for the electrical current facilitates increasing a rate at which the process region is plated as a result of the applied electrical current and the applied electroplating solution.

In one embodiment, the conductive layer defines a metallic seed layer; and, applying electrical current to the metallic material via the electrical contacts effects plating of a metallic bulk layer over the process region of the substrate.

In one embodiment, the conductive layer is defined by a metal selected from the group consisting of copper, cobalt, ruthenium, or gold.

In one embodiment, the metallic material is defined by a metal selected from the group consisting of copper, cobalt, ruthenium, nickel, palladium, gold or alloys of these elements.

In one embodiment, a thickness of the conductive layer is in the range of about 10 to 200 angstroms.

In one embodiment, increasing the rate at which the process region is plated is defined by increasing the applied electrical current while the electroplating solution is applied over the process region of the substrate, the increased thickness of the metallic material and resulting reduced electrical resistance facilitating increasing the applied electrical current.

In one embodiment, the rate at which the process region is plated increases from an initial rate to an increased rate that is approximately linearly correlated to the increased thickness of the metallic material.

In one embodiment, the conductive layer defines a liner layer or a barrier layer; and applying electrical current to the metallic material via the electrical contacts effects plating of a metallic seed layer or a metallic bulk layer over the process region of the substrate.

In another embodiment, a method for processing a substrate is provided, including: receiving a substrate having a metallic seed layer; applying an electroless deposition solution to a first portion of the metallic seed layer, defined at an edge exclusion region of the substrate, to selectively deposit an edge metallization layer over the first portion of the metallic seed layer; applying electrical contacts to the edge metallization layer; exposing a second portion of the metallic seed layer, defined at a device region of the substrate, to an electroplating solution; applying a current to the electrical contacts, to electroplate a metallic bulk layer over the second portion of the metallic seed layer.

In one embodiment, applying the electroless deposition solution includes directing a nozzle towards a peripheral location of the substrate in the edge exclusion region, rotating the substrate, and dispensing the electroless deposition solution from the nozzle as the substrate is rotated.

In one embodiment, a thickness of the edge metallization layer is defined by a duration of the application of the electroless deposition solution to the first portion of the metallic seed layer.

In one embodiment, the duration is predefined to increase the thickness of the edge metallization layer and thereby reduce resistance when the current is applied via the electrical contacts.

In one embodiment, the edge metallization layer provides for an increased conductance of the substrate in the edge exclusion region to accommodate an increased current from the electrical contacts.

In one embodiment, the metallic seed layer and the edge metallization layer are defined by a same metal, such that depositing the edge metallization layer thickens the seed layer in the edge exclusion region.

In one embodiment, the metallic seed layer is defined by a metal selected from the group consisting of copper, cobalt, ruthenium, or gold.

In one embodiment, the edge metallization layer is defined by a metal selected from the group consisting of copper, cobalt, ruthenium, nickel, palladium, gold or their alloys.

In one embodiment, the edge metallization layer has a thickness in the range of approximately 50 to 200 angstroms.

In one embodiment, applying the current includes increasing a level of the current as the metallic bulk layer is deposited, to increase a rate of deposition of the metallic bulk layer.

In one embodiment, the method further includes: preventing exposure of the electrical contacts and the edge exclusion region to the electroplating solution.

In another embodiment, a system for electroless deposition on a substrate is provided, including: a chamber; a substrate support disposed in the chamber, the substrate support configured to receive a substrate having a conductive layer disposed on a top surface of the substrate, the top surface of the substrate having an edge exclusion region defined as an annular area that extends to an edge of the substrate, the top surface of the substrate further having a process region defined as a central area of the substrate that extends to about the annular area, wherein the substrate support is configured to rotate the substrate; a solution container configured to hold an electroless deposition solution; a dispenser coupled to the solution container, the dispenser configured to provide a flow of the electroless deposition solution; a controller, the controller configured to direct the flow of the electroless deposition solution toward the edge exclusion region while the substrate is rotated, the flow being directed away from the process region, such that the electroless deposition solution is substantially directed over the annular area of the edge exclusion region, the electroless deposition solution plates metallic material over the conductive layer at the edge exclusion region, wherein the flow of the electroless deposition solution is continued for a period of time, the period of time being predefined to produce an increased thickness of the metallic material at the edge exclusion region, wherein the increased thickness of the metallic material reduces electrical resistance of the metallic material at the edge exclusion region.

In one embodiment, the system further includes: an electroplating module, the electroplating module including, electrical contacts for contacting the metallic material, the electrical contacts being distributed around the annular area of the edge exclusion region when contacting the metallic material, a solution tank configured to hold an electroplating solution, a power source configured to apply electrical current to the metallic material via the electrical contacts while the electroplating solution is applied over the process region of the substrate, the increased thickness and resulting reduced electrical resistance for the electrical current facilitates increasing a rate at which the process region is plated as a result of the applied electrical current and the applied electroplating solution.

In one embodiment, the electrical contacts are arranged in a circular array, each electrical contact being independently movable.

In one embodiment, the system further includes: an annular seal configured to contact the metallic material and prevent the electroplating solution from contacting the electrical contacts.

In one embodiment, the conductive layer defines a metallic seed layer; and applying electrical current to the metallic material via the electrical contacts effects plating of a metallic bulk layer over the process region of the substrate.

In one embodiment, increasing the rate at which the process region is plated is defined by increasing the applied electrical current while the electroplating solution is applied over the process region of the substrate, the increased thickness of the metallic material and resulting reduced electrical resistance facilitating increasing the applied electrical current.

In one embodiment, the rate at which the process region is plated increases from an initial rate to an increased rate that is approximately linearly correlated to the increased thickness of the metallic material.

In one embodiment, the conductive layer defines a liner layer or a barrier layer; and applying electrical current to the metallic material via the electrical contacts effects plating of a metallic seed layer or a metallic bulk layer over the process region of the substrate.

In one embodiment, the dispenser includes: a nozzle configured to deliver the flow of the electroless deposition solution to the surface of the substrate as a stream or a spray having a predefined width and a predefined flow velocity; a dispense arm, the dispense arm being adjustable by the controller to maneuver the nozzle to direct the stream or spray of the electroless deposition solution over the edge exclusion region, the nozzle being maneuvered by the dispense arm so that a central axis of the stream or spray forms an incident angle relative to the top surface of the substrate and exhibits a horizontal direction parallel to the top surface of the substrate, the horizontal direction being between a radial direction of the substrate and a tangential direction of the substrate that are defined substantially at a location at which the central axis of the stream or spray contacts the surface of the substrate.

In one embodiment, the system further includes: a motor for rotating the substrate support, the motor being operable by the controller to rotate the substrate support at a predefined rotational speed in the range of about 6 to 200 rotations per minute (RPM); wherein the rotation of the substrate provides a centrifugal acceleration to the electroless deposition solution that is over the edge exclusion region, so that electroless deposition solution that is provided to an inner region of the annular area of the edge exclusion region is accelerated towards an outer region of the annular area of the edge exclusion region, to provide a substantially even distribution of the electroless deposition solution over the edge exclusion region as the electroless deposition solution over the edge exclusion region is impelled by the stream or spray in combination with the centrifugal acceleration.

In one embodiment, the system further includes: a drain defined at a bottom portion of the chamber; wherein an inner surface of the chamber is contoured to deflect electroless deposition solution escaping from top surface of the substrate and direct the deflected electroless deposition solution away from the substrate surface and towards the drain.

In one embodiment, the system further includes: a sensor for detecting the thickness of the metallic material, wherein the controller is configured to terminate the flow of the electroless deposition solution over the edge exclusion region when the detected thickness of the metallic material reaches a predefined thickness level.

A substrate configured to define at least one device, comprising: a substrate; wherein the substrate having a conductive layer disposed on a top surface of the substrate, the top surface of the substrate having an edge exclusion region defined as an annular area that extends to an edge of the substrate, the top surface of the substrate further having a process region defined as a central area of the substrate that extends to about the annular area; wherein the substrate having a metallic material deposited over the conductive layer at the edge exclusion region, wherein a thickness of the metallic material reduces electrical resistance of the metallic material at the edge exclusion region; wherein the increased thickness and resulting reduced electrical resistance for the electrical current facilitates increasing a rate at which the process region is plated as a result of an applied electrical current and an applied electroplating solution.

BRIEF DESCRIPTION OF THE DRAWINGS

The invention, together with further advantages thereof, may best be understood by reference to the following description taken in conjunction with the accompanying drawings.

DETAILED DESCRIPTION

Figure 1A:
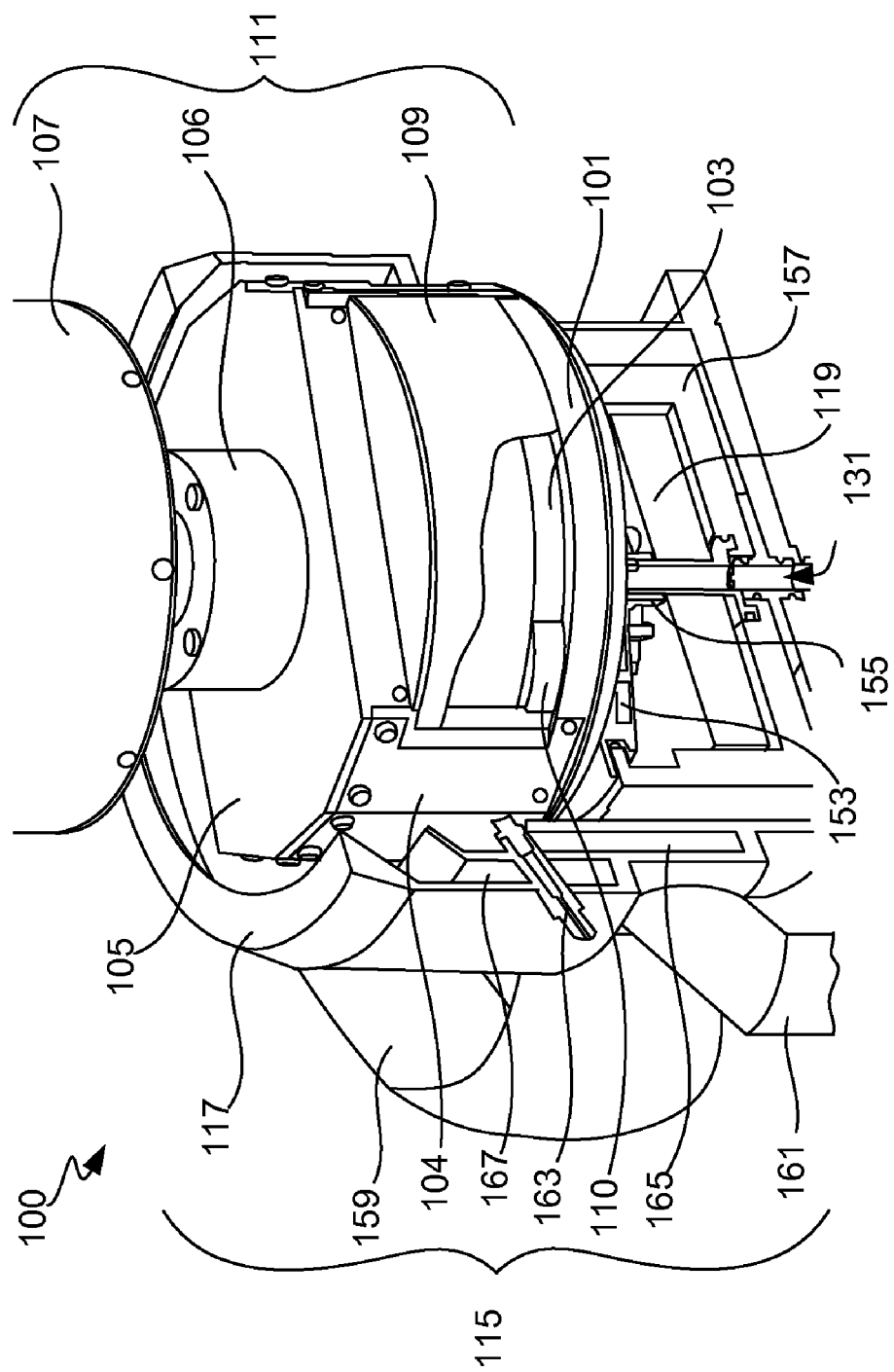
FIG. 1A presents a perspective view of a wafer holding and positioning apparatus 100 for electrochemically treating semiconductor wafers.

Disclosed are methods and systems for wafer edge metallization for optimized electroplating performance on resistive substrates.

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

As described above, electroplating on highly resistive substrates is an important technology for future metallization schemes in the semiconductor industry. As the PVD seed layer becomes thinner or eliminated entirely, the substrate surface will be increasingly resistive and difficult to plate. Solutions addressing plating current variability due to the large terminal effect during electroplating on highly resistive substrates include the use of special electrical contacts to supply the current to the wafer. Usually these contacts touch only the outer 1-2 mm of the wafer to avoid active die areas and are kept sealed from plating solution in order to avoid causing defects on the wafers. As such, the contact area is not plated and remains at its initial resistive condition during plating, while the plated area of the wafer becomes more conductive as it is plated. This results in a limitation of how much current can be delivered to the wafer compared to a situation where the contact ring touches the wafer on a conductive PVD Cu seed.

In an overall process flow, an electroplating seeding step may precede the electrofilling step in which the features will be filled with Cu. In the seeding step, the above contact scheme leads to better conductivity across the bulk of the wafer, but high resistance remains in the contact area. Following the seeding step, a normal electroplating step is needed to fill the features with copper. However, the current during the fill step is limited by the lack of metal in the contact area slowing the throughput of the filling process.

One possible solution for this problem is to form the electroplated seed layer using electrical contacts which are not isolated from the plating solution allowing the full face of the wafer to be plated. This has the drawback of plating the contacts and causing possible particle defect issues.

Another solution is to use contact positions and seals with a smaller diameter for the filling step than for the seeding step such that contact during the filling step can take place on plated seed. This has the drawback that wafer area for useable die is lost.

Another solution to the problem is to metalize the edge region separately either before the seed electroplating or after the seed plating process (depending on the application). The edge metallization process can be done by electroless plating, electroplating, PVD, ALD.

Electrochemical deposition may be employed at various points in the integrated circuit fabrication and packaging process. The first steps in making transistors are referred to as front end of the line (FEOL) processing. The processes involved in making the metal interconnections are referred to as back end of the line (BEOL) processing. At the IC chip level, damascene features are created during BEOL processing by electrodepositing copper or other sufficiently conductive material within vias and trenches to form multiple interconnected metallization layers. Generally, there is an increasing hierarchy of larger interconnect feature scales moving away from the transistor level. The back end of the line generally ends with hermetic sealing of the wafer (e.g. with SiN), referred to as a wafer passivation layer.

FIG. 1A presents a perspective view of a wafer holding and positioning apparatus 100 for electrochemically treating semiconductor wafers. The apparatus 100 includes wafer-engaging components, which are sometimes referred to as "clamshell" components, a "clamshell" assembly, or a "clamshell." The clamshell assembly comprises a cup 101 and a cone 103. The cup 101 holds a wafer and the cone 103 clamps the wafer securely in the cup. Other cup and cone designs beyond those specifically depicted here can be used. A common feature is a cup that has an interior region in which the wafer resides and a cone that presses the wafer against the cup to hold it in place.

In the depicted embodiment, the clamshell assembly (the cup 101 and the cone 103) is supported by struts 104, which are connected to a top plate 105. This assembly (101, 103, 104, and 105) is driven by a motor 107 via a spindle 106 connected to the top plate 105. The motor 107 is attached to a mounting bracket (not shown). The spindle 106 transmits torque (from the motor 107) to the clamshell assembly causing rotation of a wafer (not shown in this Figure) held therein during plating. An air cylinder (not shown) within the spindle 106 also provides a vertical force for engaging the cup 101 with the cone 103. When the clamshell is disengaged (not shown), a robot with an end effector arm can insert a wafer in between the cup 101 and the cone 103. After a wafer is inserted, the cone 103 is engaged with the cup 101, which immobilizes the wafer within apparatus 100 leaving only the wafer front side (work surface) exposed to electrolyte.

In certain embodiments, the clamshell includes a spray skirt 109 that protects the cone 103 from splashing electrolyte. In the depicted embodiment, the spray skirt 109 includes a vertical circumferential sleeve and a circular cap portion. A spacing member 110 maintains separation between the spray skirt 109 and the cone 103.

For the purposes of this discussion, the assembly including components 101-110 is collectively referred to as a "substrate holder" 111. Note however, that the concept of a "substrate holder" extends generally to various combinations and sub-combinations of components that engage a substrate and allow its movement and positioning.

A tilting assembly (not shown) may be connected to the wafer holder to permit angled immersion (as opposed to flat horizontal immersion) of the wafer into a plating solution. A drive mechanism and arrangement of plates and pivot joints are used in some embodiments to move wafer the holder 111 along an arced path (not shown) and, as a result, tilt the proximal end of substrate holder 111 (i.e., the cup and cone assembly).

Further, the entire wafer holder 111 is lifted vertically either up or down to immerse the proximal end of wafer holder into a plating solution via an actuator (not shown). Thus, a two-component positioning mechanism provides both vertical movement along a trajectory perpendicular to an electrolyte surface and a tilting movement allowing deviation from a horizontal orientation (i.e., parallel to the electrolyte surface) for the wafer (angled-wafer immersion capability).

Note that the wafer holder 111 is used with a plating cell 115 having a plating chamber 117 which houses an anode chamber 157 and a plating solution. The chamber 157 holds an anode 119 (e.g., a copper anode) and may include membranes or other separators designed to maintain different electrolyte chemistries in the anode compartment and a cathode compartment. In the depicted embodiment, a diffuser 153 is employed for directing electrolyte upward toward the rotating wafer in a uniform front. In certain embodiments, the flow diffuser is a high resistance virtual anode (HRVA) plate, which is made of a solid piece of insulating material (e.g. plastic), having a large number (e.g. 4,000-15,000) of one dimensional small holes (0.01 to 005 inch in diameter) and connected to the cathode chamber above the plate. The total cross-section area of the holes is less than about 5 percent of the total projected area, and, therefore, introduces substantial flow resistance in the plating cell helping to improve the plating uniformity of the system. Additional description of a high resistance virtual anode plate and a corresponding apparatus for electrochemically treating semiconductor wafers is provided in U.S. application Ser. No. 12/291,356 filed on Nov. 7, 2008, incorporated herein, in its entirety, by reference. The plating cell may also include a separate membrane for controlling and creating separate electrolyte flow patterns. In another embodiment, a membrane is employed to define an anode chamber, which contains electrolyte that is substantially free of suppressors, accelerators, or other organic plating additives.

The plating cell may also include plumbing or plumbing contacts for circulating electrolyte through the plating cell—and against the work piece being plated. For example, the cell 115 includes an electrolyte inlet tube 131 that extends vertically into the center of anode chamber 157 through a hole in the center of anode 119. In other embodiments, the cell includes an electrolyte inlet manifold that introduces fluid into the cathode chamber below the diffuser/HRVA plate at the peripheral wall of the chamber (not shown). In some cases, the inlet tube 131 includes outlet nozzles on both sides (the anode side and the cathode side) of the membrane 153. This arrangement delivers electrolyte to both the anode chamber and the cathode chamber. In other embodiments, the anode and cathode chamber are separated by a flow resistant membrane 153, and each chamber has a separate flow cycle of separated electrolyte. As shown in the embodiment of FIG. 1A, an inlet nozzle 155 provides electrolyte to the anode-side of membrane 153.

In addition, plating cell 115 includes a rinse drain line 159 and a plating solution return line 161, each connected directly to the plating chamber 117. Also a rinse nozzle 163 delivers deionized rinse water to clean the wafer and/or cup during normal operation. Plating solution normally fills much of the chamber 117. To mitigate splashing and generation of bubbles, the chamber 117 includes an inner weir 165 for plating solution return and an outer weir 167 for rinse water return. In the depicted embodiment, these weirs are circumferential vertical slots in the wall of the plating chamber 117.

Figure 1B:
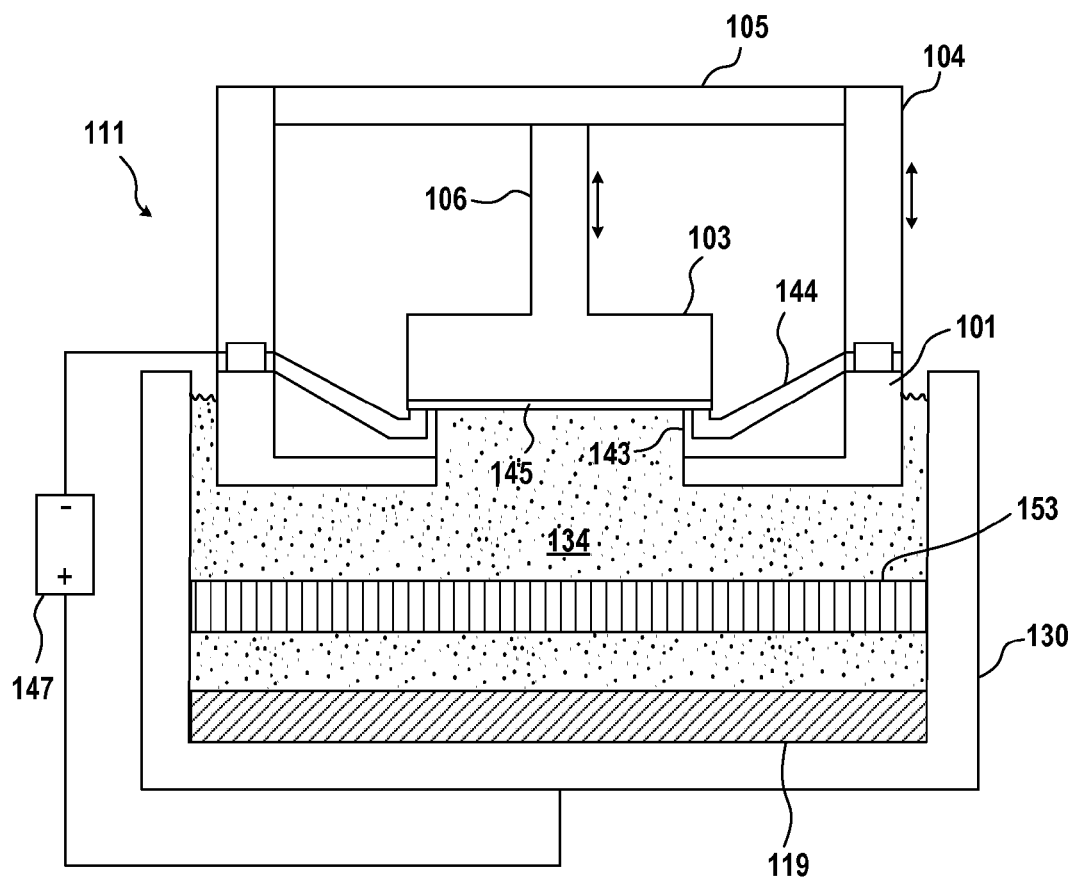
FIG. 1B provides a more detailed view of a substrate holder, including a cross-sectional view of a cup and cone assembly.

FIG. 1B provides a more detailed view of the substrate holder (also referred to as cup/cone assembly or "clamshell assembly") 111, including a cross-sectional view of cup 101 and cone 103. Note that the cup/cone assembly 111 depicted in FIG. 1B is not intended to be proportionately accurate, but rather is an exhibit stylized to promote the clarity of the following description. Cup 101 supports the lip seal 143, the contacts 144, buss bar, and other elements, and is itself supported by top plate 105 via struts 104. Generally, a substrate 145 rests on the lip seal 143, just above the contact 144, which is configured to support it. Cup 101 defines an opening through which an electroplating bath solution may contact the substrate 145. Note that electroplating takes place on the front side 142 of substrate 145. Thus, the periphery of substrate 145 rests on a bottom inward protrusion of the cup 101 (e.g., "knife-shaped" edge) or more specifically on lip seal 143 which is positioned on the bottom inward protrusion of cup 101.

Figure 1C:
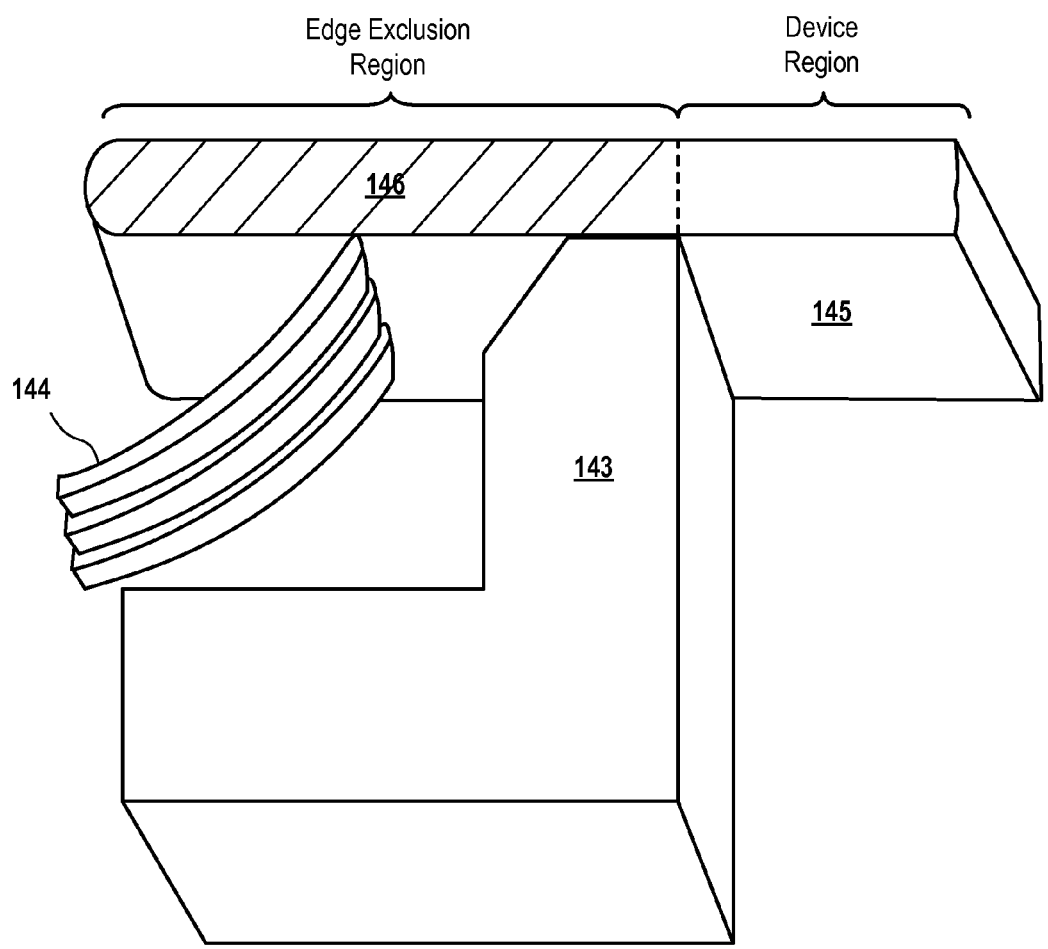
FIG. 1C shows a three-dimensional cutaway view of a portion of a substrate as it is contacted by electrical contacts and a lipseal.

Cone 103 presses down on the back side of substrate 145 to engage it and hold it in place and to seal it against lip seal 143 during submersion of the substrate into the electroplating bath during electroplating. The vertical force from cone 103, which is transferred through substrate 145 compresses lip seal 143 to form the fluid tight seal. Lip seal 143 prevents electrolyte from contacting the backside of substrate 145 (where it could introduce contaminating metal atoms directly into silicon) and from reaching sensitive components, such as contact fingers that establish electrical connections to edge portions of substrate 145. This electrical connection and associated electrical contacts 144, themselves sealed and protected by the lip seal from becoming wet, is used to supply current (from a current source 147) to conductive portions of substrate 145 that are exposed to the electrolyte. Overall, lip seal 143 separates unexposed edge portions of substrate 145 from exposed portions of substrate 145. Both portions include conductive surfaces that are in electronic communication with each other. This is further illustrated at FIG. 1C, which shows a three-dimensional cutaway view of a portion of the substrate 145 as it is contacted by the electrical contacts 144 and the lipseal 143. The lipseal 143 contacts the wafer 145 at substantially the border of the edge exclusion region 146 of the wafer. The edge exclusion region 146 may be defined by the outermost one to two millimeters of the wafer.

To load a substrate 145 into cup/cone assembly 111, cone 103 is lifted from its depicted position via spindle 106 until there is a sufficient gap between the cup 102 and the cone 103 to allow insertion of substrate 145 into the cup/cone assembly 101. The substrate 145 is then inserted, in some embodiments by a robot arm, and allowed to rest lightly on the lip seal and cup 101 (or on a related component attached to the cup, such as a lip seal 143). In some embodiments, the cone 103 is lifted from its depicted position until it touches top plate 105. Subsequently, the cone 103 is then lowered to press and engage the substrate against the periphery of cup 101 or attached lip seal 143. In some embodiments, the spindle 106 transmits both a vertical force for causing the cone 103 to engage the substrate 145, and also the torque for rotating the cup/cone assembly 111 as well as the substrate 145 being held by the cup/cone assembly. In some embodiments, electroplating of the substrate 145 typically occurs while the substrate 145 is rotating. In certain such embodiments, rotating the substrate 145 during electroplating aids in achieving uniform plating, and aids in metallic buildup removal post-deposition.

Lip seal 143 may be a single component seal or a multi-component seal. Furthermore, a variety of materials may be used to construct seal 143, as would be appreciated by one of ordinary skill in the art. For instance, in some embodiments, the lip seal is constructed of an elastomeric material, and in certain such embodiments, a perfluoropolymer.

The electroplating apparatus includes an electroplating cell 130 having a volume for holding an electroplating bath fluid 134. The substrate holder generally has a lipseal mounted in a cup, a cone movable relative to the cup and lipseal and configured to secure a substrate in the substrate holder by pressing the substrate into the lipseal, and also typically includes a plurality of electrical contact fingers which are generally protected by the lipseal when a substrate is sealed in the cup as described above and supplied with electrical charge by a power supply of the electroplating apparatus.

The substrate holder 111 is movable within the electroplating apparatus between different vertical positions depending on the mode of the electroplating apparatus. Specifically, FIG. 1B illustrates the substrate holder 111 vertically positioned in the electroplating position and holding a substrate 145 such that the surface of the substrate 145 to be electroplated upon is positioned within the volume 132 of the electroplating cell 130 which holds the electroplating bath fluid 134. In this position, the wafer holder 111 supports the substrate 145 and submerges it into the electroplating bath fluid/solution 134.

In certain embodiments corresponding to 300-mm wafer configurations, the electrical contacts 144 are defined by at least about 300 individual contact fingers evenly spaced around the entire perimeter defined by the wafer. The electrical contacts may define a continuous ring, wherein a metal strip defines the outer diameter of the ring, and the free tips of the fingers define the inner diameter. The fingers are flexible and may be pushed down when the wafer is loaded. For example, the fingers move from a free position to a different intermediate position when a wafer is placed into the clamshell to yet another different position when the cone exerts pressure onto the wafer. In their free position the fingers may extend higher than the lip 143. In certain embodiments, the fingers and/or the lip seal 143 bend or compress when the wafer is introduced into the cup and both the fingers and the lip 143 are in contact with the wafer.

Embodiments of the present disclosure may be applied on a Sabre® electroplating system supplied by Novellus Systems, Inc.

An illustrative electroplating process in accordance with certain embodiments may include the following operations. Initially, the lipseal and contact area of the clamshell may be clean and dry. The clamshell is opened and the wafer is loaded into the clamshell. In certain embodiments, the contact tips sit slightly above the plane of the sealing lip and the wafer is supported, in this case, by the array of contact tips around the wafer periphery. The clamshell is then closed and sealed by moving the cone downward. During this closure operation, the contacts are typically deflected. Further, the bottom corners of the contacts may be forced down against the elastic lipseal base, which results in additional force between the tips and the front side of the wafer. The sealing lip may be slightly compressed to ensure the seal around the entire perimeter. In some embodiments, when the wafer is initially positioned into the cup only the sealing lip is in contact with the front surface. In this example, the electrical contact between the tips and the front surface is established during compression of the sealing lip.

Once the seal and the electrical contact is established, the clamshell carrying the wafer is immersed into the plating bath and is plated in the bath while being held in the clamshell. A typical composition of a copper plating solution used in this operation includes copper ions at a concentration range of about 0.5-80 g/L, more specifically at about 5-60 g/L, and even more specifically at about 18-55 g/L and sulfuric acid at a concentration of about 0.1-400 g/L. Low-acid copper plating solutions typically contain about 5-10 g/L of sulfuric acid. Medium and high-acid solutions contain about 50-90 g/L and 150-180 g/L sulfuric acid respectively. The concentration of chloride ions may be about 1-100 mg/L. A number of copper plating organic additives, such as Enthone Viaform, Viaform NexT, Viaform Extreme (available from Enthone Corporation in West Haven, Conn.), or other accelerators, suppressors and levelers known to those of skill in the art, can be used. Examples of plating operations are described in more details in U.S. patent application Ser. No. 11/564,222 filed on Nov. 28, 2006, which is incorporated herein in its entirety for the purpose of describing plating operations. Once the plating is completed and an appropriate amount of material is deposited on the front surface of the wafer, the wafer is then removed from the plating bath. The wafer and clamshell are spun to remove most of the residual electrolyte on the clamshell surfaces remaining there due to the surface tensions. The clamshell is then rinsed while continued to be spun to dilute and flush as much of the entrained fluid as possible from clamshell and wafer surfaces. The wafer is then spun with rinsing liquid turned off for some time, usually at least about 2 seconds to remove some remaining rinsate.

Figure 2:
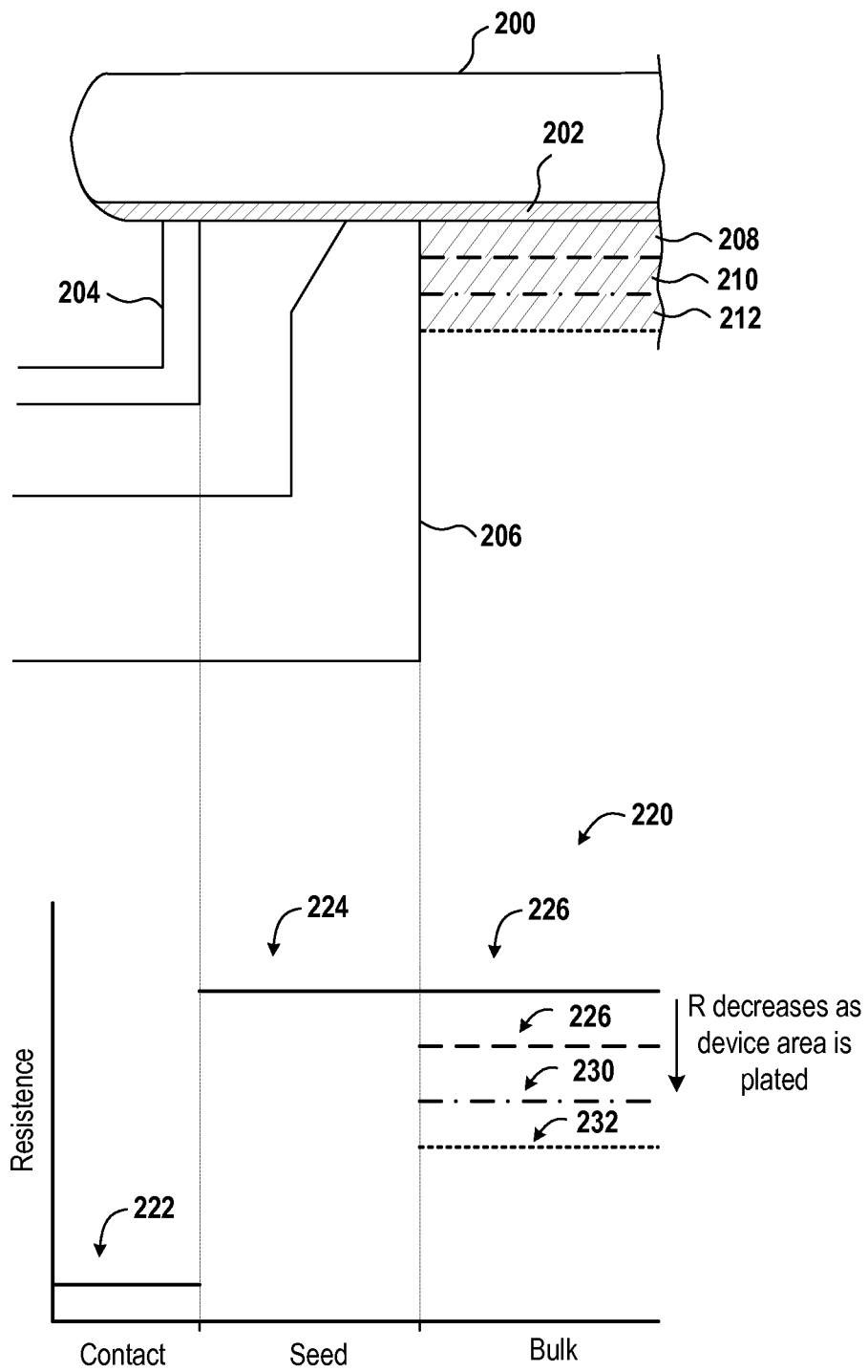
FIG. 2 illustrates an outer portion of a wafer as it is being electroplated by apparatus in accordance with that shown above.

FIG. 2 illustrates an outer portion of a wafer 200 as it is being electroplated by apparatus in accordance with that described above. Also shown is a graph 220 illustrating the varying resistance along different portions of the wafer 200.

Prior to undergoing electroplating, the wafer 200 includes a conductive layer 200, which may be a metallic seed layer, or a liner layer or a barrier layer, in accordance with various embodiments. A current is applied to the conductive layer 202 via electrical contacts 204, and lipseal 206 serves to seal off the outer exclusion region of the substrate in which the electrical contact is made, as discussed above.

As the wafer 202 is electroplated, metallic material is deposited over that portion of the conductive layer 202 that is exposed to the plating solution. Though the metallic material is continuously deposited during the electroplating procedure, it is useful for purposes of illustration to conceptualize various layers of the metallic material being deposited which define the entire deposited material in aggregate. During a first time period, a first portion 208 of metallic material is deposited over the conductive layer 202; during a second time period, a second portion 210 of metallic material is deposited over the first portion; and during a third time period, a third portion 212 of metallic material is deposited over the second portion. In this manner, the thickness of metallic material that is electroplated on the conductive layer 202 is built up over time.

The graph 220 illustrates resistance of various portions along the current path that is defined by the electrical contact 204 and the wafer 200. As shown at reference 202, the resistance in the electrical contact 204 is very low until reaching the conductive layer 202. The resistance in the conductive layer 202 is quite high by comparison, as shown at reference 224. This can be due in part to the conductive layer 202 being very thin, so that even when the conductive layer is composed of an intrinsically highly conductive material such as copper, a high resistance nonetheless exists by virtue of the lack of conductive material. This high resistance condition extends from the contacting location of the electrical contact 204 on the wafer, to the outer edge of the lipseal 206, adjacent to which a portion of the front surface of the wafer 200 is exposed for plating.

As the plated portion of the wafer increases in thickness, so the resistance of this portion decreases. As shown at reference 226, initially, the resistance along the exposed portion of the conductive layer 202 is the same as that of the adjacent portion that is between the electrical contact 204 and the lipseal 206. However, after the first portion 208 is plated, the resistance drops to a level indicated at reference 228. After the second portion 210 is plated the resistance further drops to a level indicated at reference 230. After the third portion 212 is plated the resistance drops even further to a level indicated at reference 232.

However, despite the decrease in resistance (increased conductivity) of the plated region that occurs over time during the plating operation, larger current levels that would otherwise be supported by such thickness cannot be safely applied without risking damage to the wafer. This is because the maximum allowable current is limited by the high resistance condition that exists in the portion between the electrical contact 204 and the lipseal 206, through which the current passes during the electroplating process. The problem of a high resistance condition in a conductive layer such as a seed layer is becoming more significant with successive technology nodes as the seed layers become thinner. For example, the table below lists field thickness and sheet resistance of typical copper seed layers for various technology nodes. It will be appreciated that field thickness and resistivity vary substantially due to re-sputter processes and alloys. However, as can be seen, the sheet resistance of seed layers is increasing, and thereby increasingly limiting the amount of current that may be applied during electroplating operations.

| Technology Node | Typical Copper Seed Layer Thickness | Sheet Resistance |
| --- | --- | --- |
| 28 | 30-50 nm field | 0.4 to 1 Ohms/square |
| 20 | 20-40 nm field | 0.6 to 2 Ohms/square |
| 14 | 15-40 nm field | 0.8 to 4 Ohms/square |
| 10 | 10-30 nm field | 2-10 Ohms/square |

If applied current levels are too high, then there is a risk of burning the contacts and/or the conductive layer, which may result in unwanted particle generation. The conductive layer (and by extension, underlying layers) may become excessively hot, causing wear or damage resulting from thermal expansion and/or thermal cycling. Furthermore, increased amounts of heat that are generated during processing operations count against thermal budgets for fabrication. Thus, the resistance (low conductivity) of the conductive layer 202 in the edge exclusion region is a limiting factor for the amount of current that can be driven during electroplating, which consequently limits the rate at which deposition may be performed.

Figure 3A:
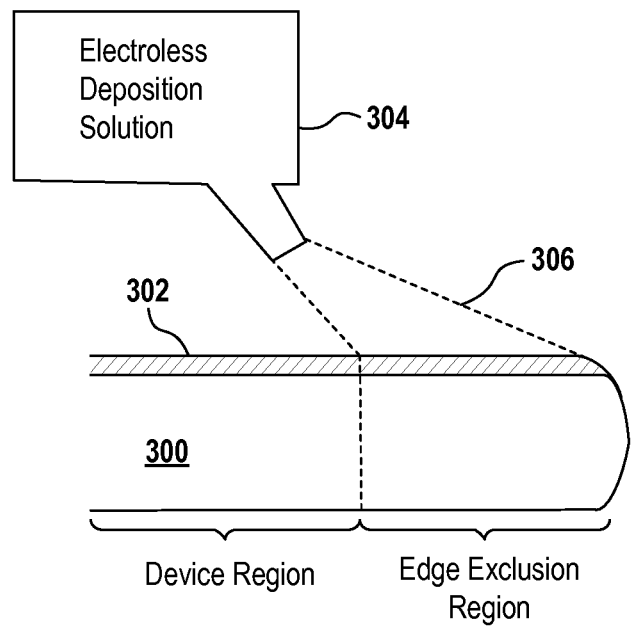
FIG. 3A illustrates a wafer having a conductive layer thereon, prior to selective edge metallization.

In view of the above, embodiments in accordance with the present disclosure provide for the selective metallization of the edge exclusion region prior to electroplating, to provide for reduced resistance in the edge exclusion region of the wafer, so that the resistance of the edge exclusion region does not become a limiting factor for the application of higher current levels to promote faster deposition. FIG. 3A illustrates a wafer 300 having a conductive layer 302 thereon, prior to selective edge metallization. In some embodiments, the conductive layer 302 may be defined by a metal such as copper, cobalt, ruthenium, or other metals or alloys. An edge exclusion region is defined as an annular area that extends to the edge of the substrate, in which devices are not formed. In accordance with some embodiments, an electroless deposition solution 304 is selectively applied over the edge exclusion region of the wafer. A process/device region is defined as a central area of the substrate that extends to about the annular area.

In some embodiments, a flow 306 of the electroless deposition solution 304 is directed toward the edge exclusion region while the substrate is rotated. The flow can be directed away from the process region, such that the electroless deposition solution is substantially directed over the annular area of the edge exclusion region. The electroless deposition solution plates metallic material over the conductive layer at the edge exclusion region. In various embodiments, the flow 306 of the electroless deposition solution 304 can be defined as a stream or spray directed towards the exposed surface of the wafer that is in the edge exclusion region.

Figure 3B:
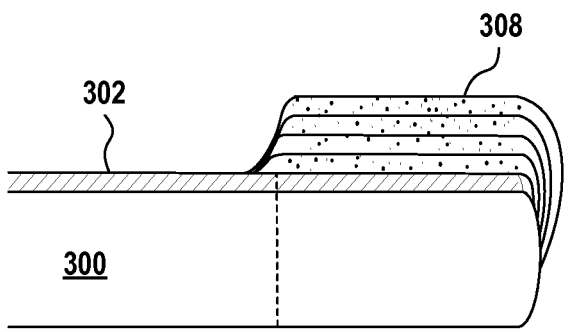
FIG. 3B illustrates a deposited metallic material that defines an edge metallization layer and provides a substantially thickened conductive material in the edge exclusion portion of a wafer.

The flow of the electroless deposition solution is continued for a period of time that can be predefined to produce an increased thickness of the metallic material at the edge exclusion region. Initially, the electroless deposition solution is applied over the conductive layer that is in the edge exclusion region of the wafer. As the metallic material is deposited from the electroless deposition solution, then in subsequent time periods, the electroless deposition solution is applied over the existing deposited metallic material, and the thickness of the deposited metallic material is built up over time and substantially determined by the duration of exposure of the wafer to the electroless deposition solution. At FIG. 3B, the deposited metallic material 308 defines an edge metallization layer and provides a substantially thickened conductive material in the edge exclusion portion of the wafer.

The edge metallization layer provides for a significantly reduced level of resistance (increase in conductivity) in the edge exclusion region, as compared to a wafer without the edge metallization layer, with increased thickness of the metallic material providing further reduction in electrical resistance of the metallic material at the edge region. As a result, during a subsequent electroplating process in accordance with systems described above, higher levels of current can be applied without risking damage to the wafer, and thereby increasing the rate of deposition.

It will be appreciated that the edge metallization scheme described herein is applicable to a variety of wafer processing configurations as a way to reduce resistance of the conductive path at the edge exclusion region, and thereby facilitate faster electroplating through the application of higher current. Furthermore, it is contemplated that the metallic material that is deposited at the edge exclusion region may be any metal or alloy that when deposited, serves to reduce the resistance of the conductive path defined at the edge exclusion region. By way of example, in some embodiments, the metallic material consists of copper, cobalt, ruthenium, or gold.

Broadly speaking, metals having a higher conductivity will provide for greater gains in terms of allowable current flow at smaller thicknesses. However, other considerations such as cost and the relative ease of deposition onto the conductive layer may also inform the selection of a metal to define the metallic material.

Additionally, it is noted that in some embodiments, the metallic material is the same metal or alloy as that of the conductive layer on which the metallic material is deposited. Whereas in other embodiments, the metallic material is a different metal or alloy than that of the conductive layer. However, it should be noted that certain combinations of metals may be susceptible to galvanic corrosion due to the variance in the electropotentials of the different metals. Therefore, in embodiments wherein the metallic material differs from that of the conductive layer, it is generally preferable to select a metal having a similar electropotential as that of the conductive layer to avoid potential galvanic corrosion, provided that the metal provides for a suitable level of conductance.

In some embodiments, the conductive layer 302 is a metallic seed layer. In one embodiment, the conductive layer is a copper seed layer, and the deposited metallic material is defined by copper metal which effectively thickens the copper seed layer. The thickened copper seed layer significantly increases the conductivity of the wafer surface at the edge exclusion region. Following deposition of the edge metallization layer over the seed layer in the edge exclusion region, an electroplating process is performed to deposit a bulk layer over the metallic seed layer in the device/process region of the substrate. As discussed in further detail below, the presence of the edge metallization layer facilitates the application of increased current levels during the electrodeposition of the bulk metallic layer.

In other embodiments, the conductive layer 302 is a liner or barrier layer, or combination thereof. As compared to metallic seed layers, a barrier/liner stack may exhibit significantly higher levels of resistance, often in the range of 100 to 1000 Ohms/Square. This means that without edge metallization, the high resistance (and low conductivity) of the barrier/liner stack can become a limiting factor for the amount of current that may be safely applied during electroplating. Therefore, in accordance with certain embodiments of the invention, an edge metallization layer is deposited over the barrier/liner stack in the edge exclusion region of the wafer. The edge metallization layer is defined by a deposited metallic material which may be the same as or different from that of the underlying barrier/liner material. In some embodiments, the metallic material is chosen to be more conductive than the barrier/liner material, so as to promote a greater increase in conductivity at the edge exclusion region than would be possible through thickening of the liner/barrier materials alone.

Figure 4:
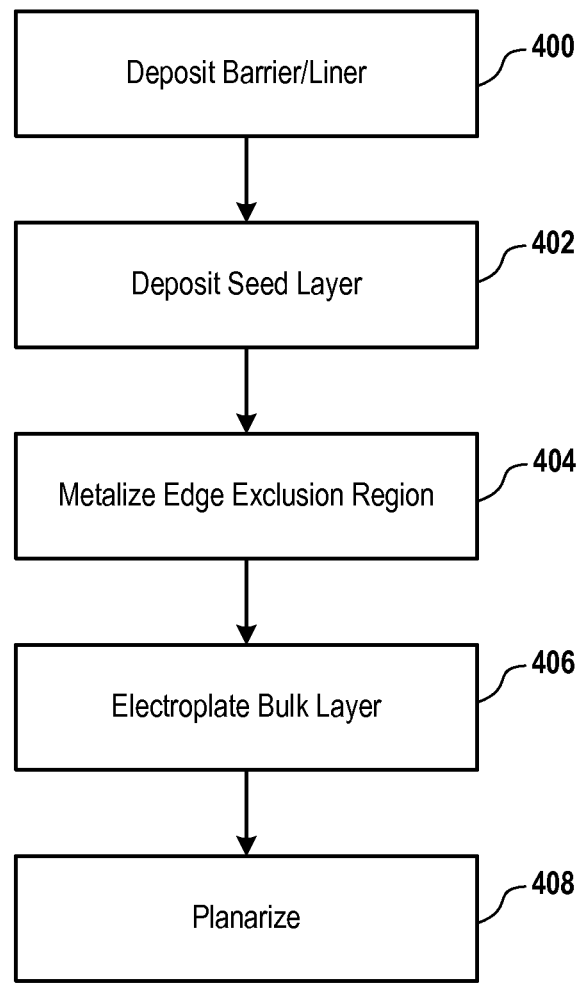
FIG. 4 illustrates a method for processing a wafer, in accordance with an embodiment of the invention.

FIG. 4 illustrates a method for processing a wafer, in accordance with an embodiment of the invention. At method operation 400, a barrier/liner stack is deposited on the surface of the wafer. Exemplary methods for deposition of the barrier/liner stack include, CVD, PVD, ALD, etc. At method operation 402, a metallic seed layer is deposited over the barrier/liner stack. The metallic seed layer may be deposited by PVD in certain implementations, though other methods of deposition may be employed. At method operation 404, the edge exclusion region is metalized by the deposition of metallic material over the metallic seed layer in the edge exclusion region. At method operation 406, an electroplating process is performed to deposit a metallic bulk layer over the metallic seed layer in the device/process region of the substrate. As discussed in further detail below, the current level is increased during the course of the electroplating procedure in order to facilitate faster deposition of the bulk layer as the wafer surface becomes more conductive. Following the deposition of the bulk layer, then at operation 408, a planarization procedure is performed, such as chemical mechanical polishing (CMP).

Figure 5A:
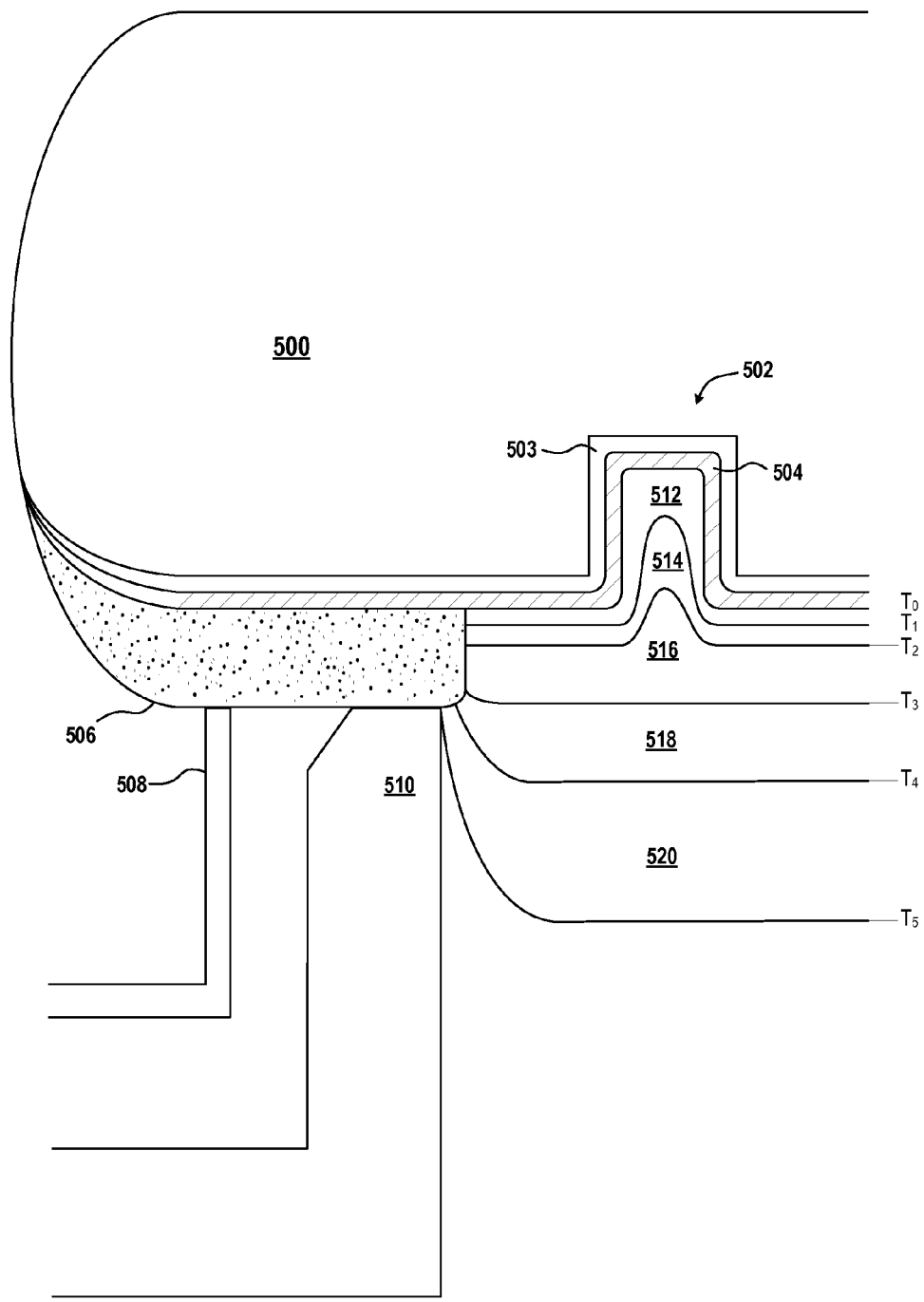
FIG. 5A illustrates the deposition of a bulk layer over a seed layer on a wafer, in accordance with an embodiment of the invention.

FIG. 5A illustrates the deposition of a bulk layer over a seed layer on a wafer 500, in accordance with an embodiment of the invention. The wafer 500 includes a feature 502, which in the illustrated embodiment is a trench, but may be any other feature which may be formed on the surface of a substrate. A barrier/liner stack 503 is present on the wafer 500, as well as a seed layer 504 deposited over the barrier/liner stack. The barrier/liner stack as well as the seed layer extend over the front surface of the wafer 500. However, in the edge exclusion region which is a peripheral region of the wafer in which devices are not fabricated (e.g. the outer two millimeters of the wafer), an edge metallization layer 506 has been selectively deposited over the seed layer 504 in the edge exclusion region.

For the electroplating procedure, electrical contacts 508 are brought into contact with edge metallization layer 506 along an outer diameter of the edge metallization layer. Current from a current source is supplied via the electrical contacts 508 to the edge metallization layer 506. Lipseal 510 is sealed against the edge metallization layer 506 along an inner diameter of the edge metallization layer relative to that of the electrical contacts, to prevent exposure of the electrical contacts 508 as well as the backside of the wafer to the electroplating solution.

It will be appreciated that the thickness of the edge metallization layer can be substantially uniform over the flat portion of the edge exclusion region. However, at the bevel edge of the substrate, the thickness of the edge metallization layer decreases. In some embodiments, electrical contact is made with the edge metallization layer at the bevel edge. Therefore, in such embodiments, the thickness of the edge metallization layer may be less than the nominal thickness of the edge metallization layer that is over the flat portion of the edge exclusion region of the wafer. For example, for a nominal edge metallization layer thickness of about 10-20 nm, the thickness at the point of electrical contact may be about 5-10 nm.

With continued reference to FIG. 5A, the deposition of the bulk layer at various equivalent time intervals is shown. Between times $T_0$ and $T_1$, a portion 512 of the bulk layer is deposited; between times $T_1$ and $T_2$, a portion 514 of the bulk layer is deposited; between times $T_2$ and $T_3$, a portion 516 of the bulk layer is deposited; between times $T_3$ and $T_4$, a portion 518 of the bulk layer is deposited; and between times $T_4$ and $T_5$, a portion 520 of the bulk layer is deposited.

Figure 5B:
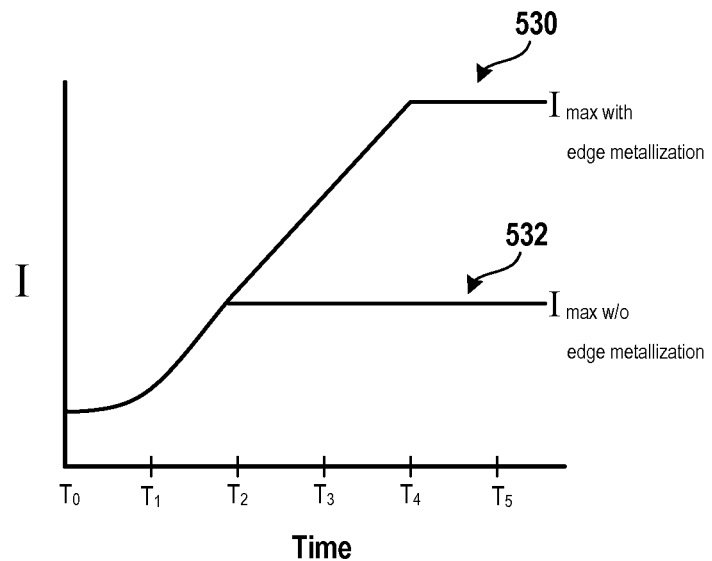
FIG. 5B illustrates a graph of current applied during an electroplating procedure as a function of time, in accordance with an embodiment of the invention.
Figure 5C:
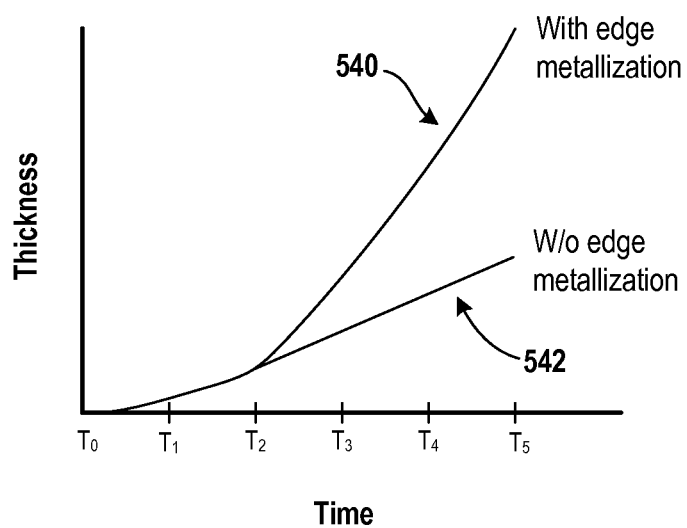
FIG. 5C illustrates a graph of the thickness of a bulk layer over time, in accordance with an embodiment of the invention.

The deposition of the bulk layer may be further understood with reference to FIG. 5B, which illustrates a graph of the current applied during the electroplating procedure as a function of time, and with reference to FIG. 5C, which illustrates a graph of the thickness of the bulk layer over time. Between $T_0$ and $T_1$, the current applied is fairly constant at a low level to ensure proper filling of the feature 504 without introducing defects. The initial portion 512 is plated directly over the seed layer 504, and the overall thickness of the bulk layer increases at a slow rate.

Following deposition of portion 512, the feature 502 has been filled to a certain extent so that defects are less likely with increased current, and the wafer surface has become more conductive due to the metal that has been plated, and therefore the level of current applied via the contacts 508 may be gradually increased. The result is that between times T1 and T2, a portion 514 is plated over the portion 512, the portion 514 being thicker than the portion 512 due to the increased current being applied to the wafer surface. At subsequent time periods, the process continues, with the current being increased as the thickness of the bulk layer increases and the conductivity of the wafer increases. The current is increased until a maximum current level (shown at reference 530) is reached. As the current level is increased, so subsequently deposited portions of the bulk layer are thicker than previously deposited portions of the bulk layer for equivalent time intervals. Hence, portion 516 is thicker than portion 514, portion 518 is thicker than portion 516, and portion 520 is thicker than portion 518. This is illustrated by the curve 540 which shows the thickness of the bulk layer growing at increasing rates over time.

It will be appreciated that the ability to run higher current levels as the thickness of the bulk layer increases is facilitated by the edge metallization layer 506. For without the edge metallization layer, then the resistance of the edge exclusion region severely limits the maximum safe current to a level indicated at reference 532; whereas the maximum safe current level that is possible with the edge metallization layer, as indicated at reference 530, is significantly higher. This effect is further illustrated by curve 542, which shows the thickness of the bulk layer over time for a wafer without the edge metallization layer. As can be seen, the thickness at later time points when an edge metallization layer is applied, as shown by curve 540, is noticeably greater than the thickness when the edge metallization layer is not applied prior to the electroplating.

Figure 5D:
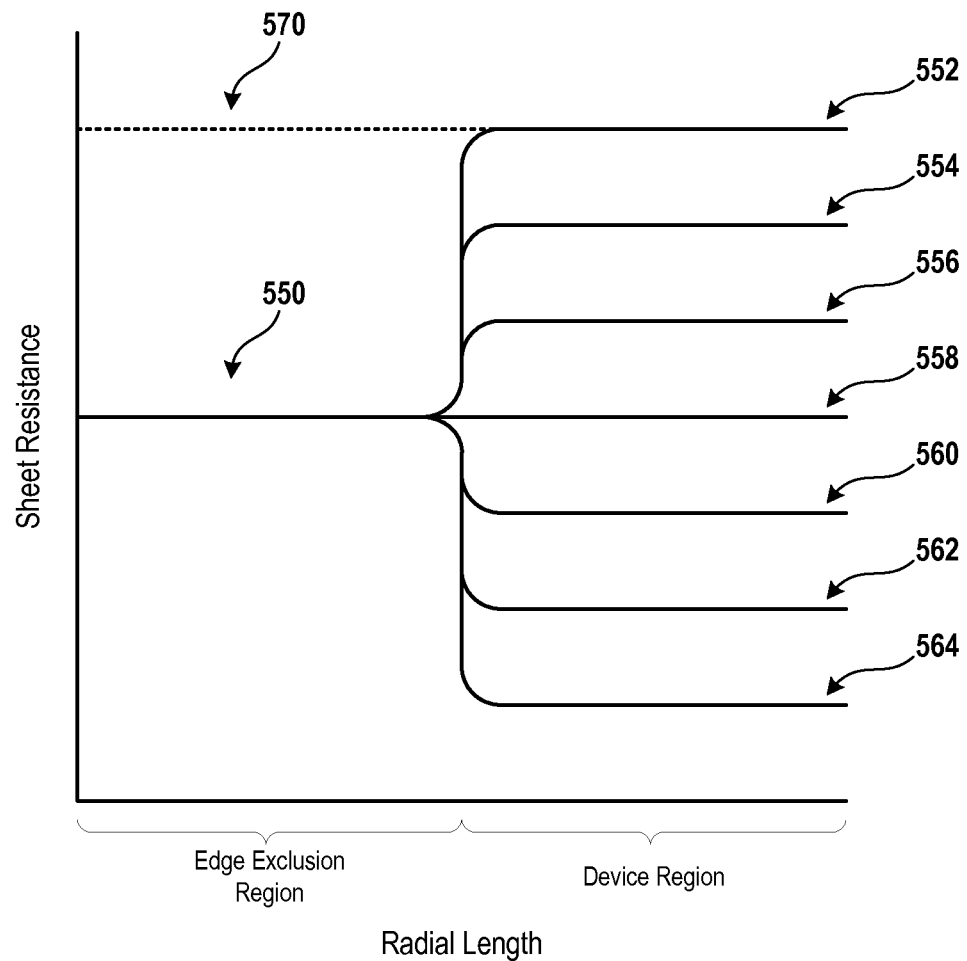
FIG. 5D illustrates a graph of sheet resistance versus radial length, from the edge towards the center of a wafer, in accordance with an embodiment of the invention.

FIG. 5D illustrates a graph of sheet resistance versus radial length, from the edge towards the center of a wafer, in accordance with an embodiment of the invention. The curve 570 illustrates the sheet resistance in the edge exclusion region of the wafer in the absence of an edge metallization process. Whereas the curve 550 illustrates the reduced sheet resistance in the edge exclusion region with an edge metallization process. The curves 552 through 564 illustrate the decreasing sheet resistance occurring over time as plating of the device region of the wafer occurs. As shown, initially the sheet resistance in the edge exclusion region is lower than that of the device region, when an edge metallization process is applied. Over time, as the device region is plated, the sheet resistance of the device region reduces until it may become lower than that of the edge exclusion region.

Figure 6:
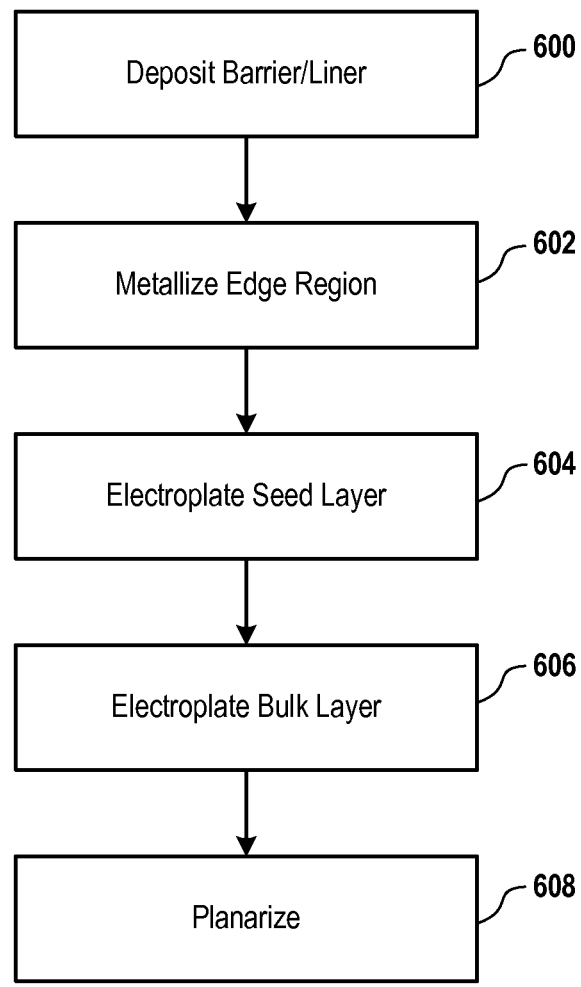
FIG. 6 illustrates a method for processing a wafer, in accordance with an embodiment of the invention.

FIG. 6 illustrates a method for processing a wafer, in accordance with an embodiment of the invention. At method operation 600, a barrier/liner stack is deposited on the surface of the wafer. Exemplary methods for deposition of the barrier/liner stack include, CVD, PVD, ALD, etc. At method operation 602, the edge exclusion region is metalized by the deposition of metallic material over the barrier/liner stack in the edge exclusion region. At method operation 604, a metallic seed layer is electroplated over the barrier/liner stack. At method operation 606, a metallic bulk layer is electroplated over the metallic seed layer in the device/process region of the substrate. In some embodiments, the electroplating of the seed layer and the electroplating of the bulk layer are different operations performed in different electroplating systems. However, in other embodiments, the electroplating of the seed layer and the electroplating of the bulk layer may be performed as a continuous process in the same electroplating system, wherein the composition of the electroplating solution and the current and/or other parameters are varied over time to effect plating of the seed followed by plating of the bulk layer in a continuous uninterrupted fashion. In accordance with the principles described herein, the current level can be increased during the course of electroplating procedures in order to facilitate faster deposition of the bulk layer as the wafer surface becomes more conductive. Following the deposition of the bulk layer, then at operation 608, a planarization procedure is performed, such as chemical mechanical polishing (CMP).

It will be appreciated that the thickness of the edge metallization layer is correlated to the maximum current which may be safely applied during electroplating without causing damage to the wafer or other problems. Broadly speaking, it is expected that the maximum current will be approximately linearly correlated to the thickness of the edge metallization layer. This can be understood from the fact that for a three-dimensional conductor, resistance is typically proportional to length, but inversely proportional to cross-sectional area, which is the product of the width and thickness of the conductor. Thus, resistance is expected to be inversely proportional to thickness. Therefore, for a given voltage drop, current is expected to be linearly correlated to the thickness of the conductor. Accordingly, it is expected that the maximum safe current level will be approximately linearly correlated to the thickness of the edge metallization layer. Furthermore, plating rate can be linearly correlated to operating current. Therefore, in some embodiments, maximum plating rate can be increased in approximately linear correlation to the thickness of the edge metallization layer, as compared to the maximum plating rate without the edge metallization layer.

Additionally, it is noted that the edge metallization layer provides for improved plating, as compared to an application without the edge metallization layer, because the additional edge metallization layer eliminates points of high resistance, and thereby provides for improved uniformity of the distribution of current. The uniform distribution of current in turn provides for improved uniformity of plating in the device region of the substrate.

Yet another benefit of the edge metallization layer is that it may also protect the underlying seed layer from corrosion.

Figure 7:
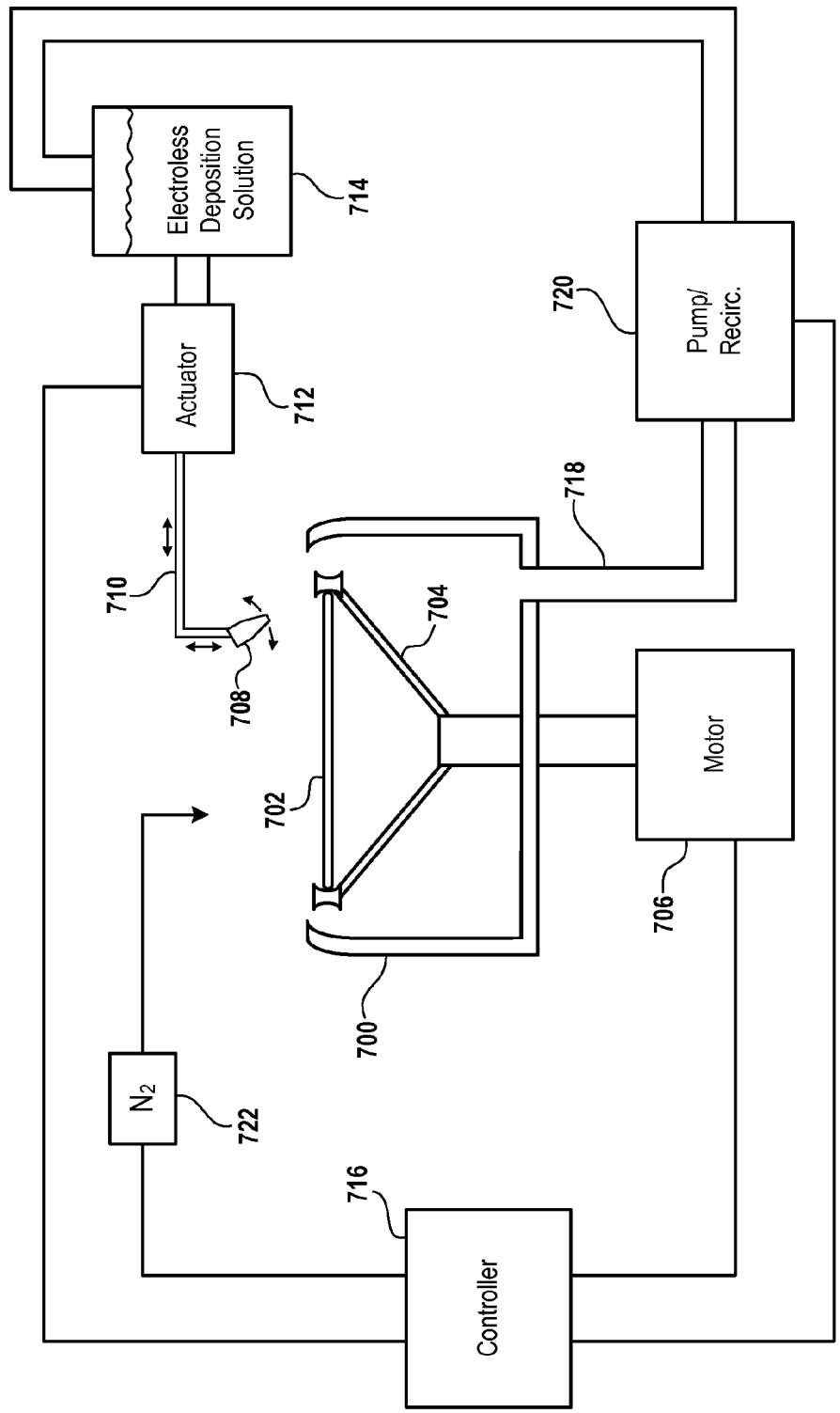
FIG. 7 schematically illustrates an electroless deposition system for performing edge metallization, in accordance with an embodiment of the invention.

FIG. 7 schematically illustrates an electroless deposition system for performing edge metallization, in accordance with an embodiment of the invention. A chamber 700 is provided in which a semiconductor wafer 702 rotates. Wafer 702 resides on a substrate support 704 (or chuck) which is configured to impart rotational motion to wafer 702. Chamber 700 is outfitted with a drain 718 that allows various liquid streams provided to chamber 700 to be removed for waste treatment and/or recirculation. A pump/recirculation module 720 is operable by the controller to manage the pumping, treatment, and recirculation of electroless deposition solution 714. It should be appreciated that in other embodiments, the used electroless deposition solution is not recirculated, but is instead expelled from the system as waste by the pump module 720.

A motor 706 controls the rotation of substrate support 704. Motor 706 should be easy to control and should smoothly transition between various rotational speeds. It may reside within or without chamber 700. In some embodiments, to protect against damage from liquids present in the chamber, motor 706 resides outside of chamber 700 and is separated there from by a seal through which a rotating shaft passes. Any wobble in the shaft on rotation should be small (~<0.05 millimeters for example) so that the location of fluid nozzles with respect to the wafer does not vary substantially, nor shake the wafer from its center while it is not confined by alignment or clamping members. Motor 706 can rapidly accelerate and decelerate (in a controlled fashion) substrate support 704 and wafer 702 at rotation rates between 0 and about 2000 rpm. The motor speed and other operations should be controllable by the controller 716.

Substrate support 704 may be of any suitable design that holds wafer 702 in position during various rotational speeds. It may also facilitate alignment of wafer 702 for the electroless deposition process. The substrate support 704 may include rollers or other shaped holders which are configured to securely grip the wafer along its outer edge. A few examples of wafer chucks are described in U.S. Pat. No. 6,537,416, incorporated by reference.

Chamber 700 may be of any suitable design that confines liquid within its interior and allows delivery of various fluids to wafer 702. It should be constructed of material that is resistant to the fluids to be applied to the wafer and include ports and nozzles for the various liquid and gaseous streams used during deposition and cleaning. The inner surface of the chamber can be contoured to deflect electroless deposition solution escaping from the top surface of the substrate and direct the deflected electroless deposition solution away from the substrate surface and towards the drain.

Gaseous nitrogen is provided from a source of nitrogen 722 to the chamber 700 to provide a substantially oxygen-free controlled ambient environment.

The electroless deposition solution 714 is applied to the edge exclusion region of the wafer 702 via a nozzle 708. The nozzle 708 is coupled to an adjustable arm 710 whose movement is controlled by an actuator 712. The arm 710 is configured to allow precise control over the positioning and direction of the nozzle 708, as discussed in further detail below. Additionally, the nozzle 708 can be adjustable to provide for a stream or spray having a predefined flow rate, velocity, and angle of dispersion, to provide for an even distribution of the electroless deposition solution over the edge exclusion region of the wafer. The combination of the control over the arm 710 and the nozzle 708 provide for 0 to 0.2 mm accuracy of solution placement, so that the electroless deposition solution can be selectively applied to the edge exclusion region of the wafer.

Figure 8A:
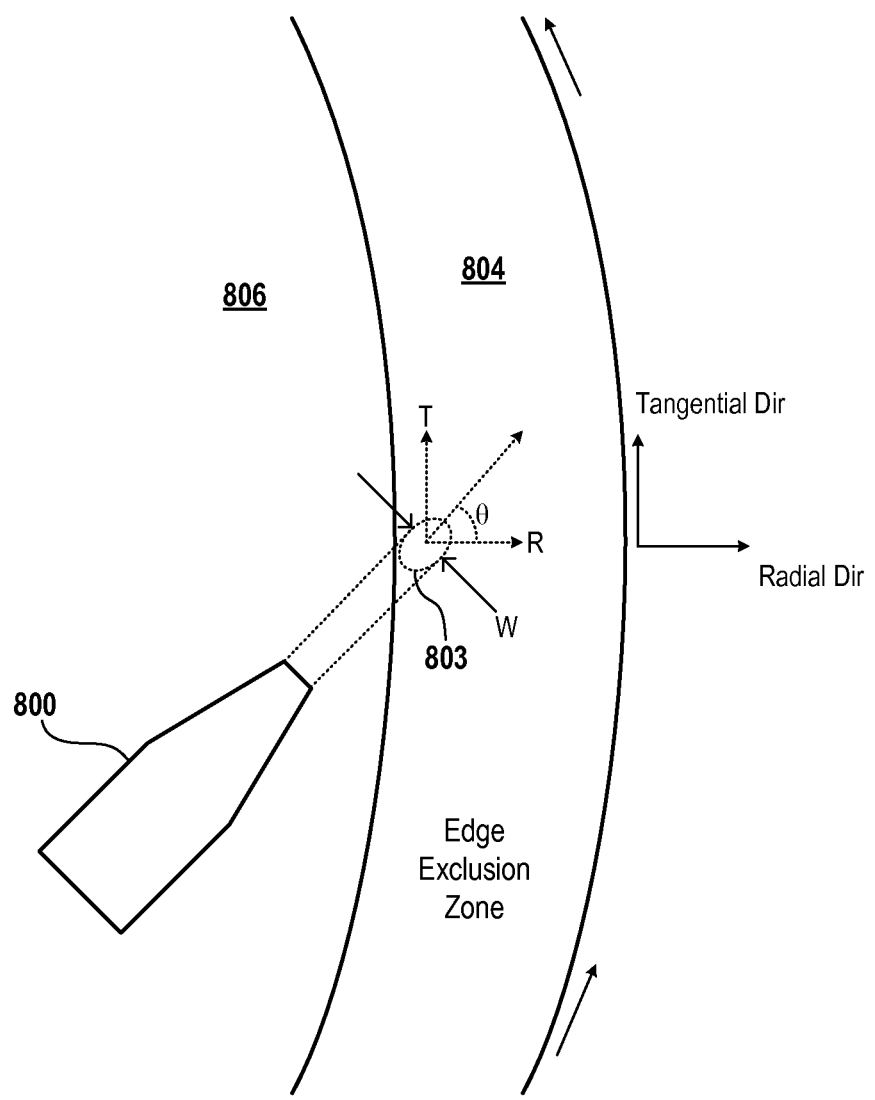
FIG. 8A illustrates a nozzle configurable to deliver a stream (or spray) of electroless deposition solution to an edge exclusion region of a wafer.

FIG. 8A illustrates a nozzle 800 configurable to deliver a stream 802 (or spray) of electroless deposition solution to an edge exclusion region 804 of a wafer 806. The nozzle is configured so that when the stream 802 reaches the surface of the wafer at a location 803, it has a width W that is dependent on the angle of dispersion of the stream/spray as well as the distance that the stream travels before hitting the wafer surface. Furthermore, the horizontal direction of stream 802 (that is, the direction in the plane defined by the wafer surface) can be adjusted to be any angle between a radial direction R and a tangential direction T which are defined with respect to the wafer at the location 803 at which the stream 802 reaches the wafer surface. The radial direction R is defined by a vector from the center of the wafer outward through the location 803. Whereas the tangential direction T is defined by a vector tangent to the outer edge of the wafer at the point at which the radial vector crosses the outer edge. (The tangential direction T may also be defined by a vector in the plane of the wafer surface that is orthogonal to the radial direction). In the illustrated embodiment, the horizontal direction of the stream 802 exhibits an angle θ relative to the radial direction. It will be appreciated that the stream 802 therefore imparts both a horizontal radial force as well as a horizontal tangential force to electroless deposition solution present on the wafer surface that is impacted by the stream 802.

Figure 8B:
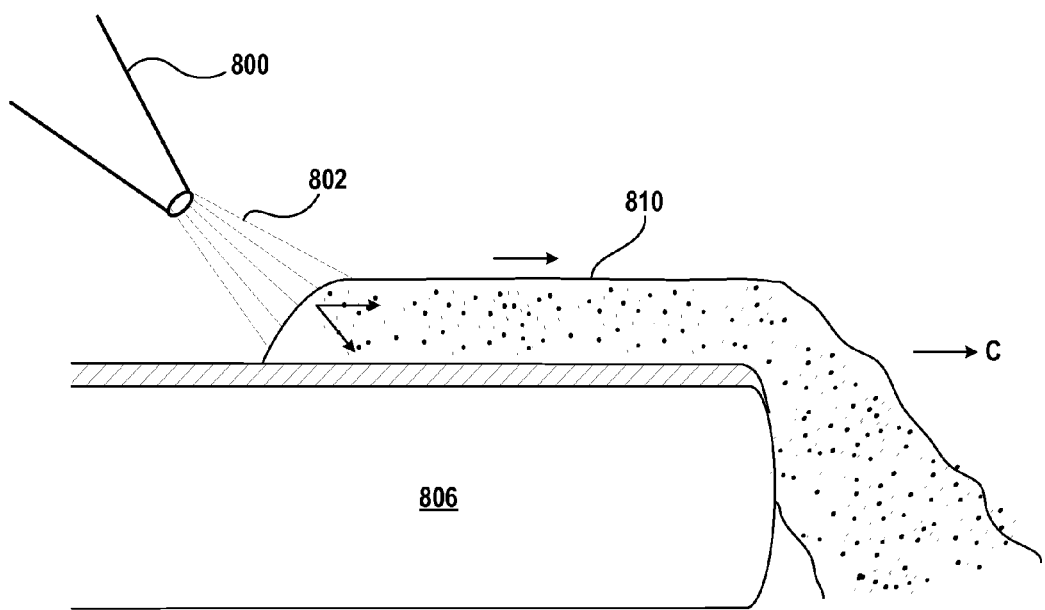
FIG. 8B illustrates the flow of electroless deposition solution over the surface of a wafer, in accordance with an embodiment of the invention.

FIG. 8B illustrates the flow of electroless deposition solution over the surface of the wafer 806, in accordance with an embodiment of the invention. The stream 802 is directed towards the wafer surface at an incident angle relative to the wafer surface. As noted above, the stream 802 may impart a horizontal radial force to electroless deposition solution 810 that is present on the wafer surface. Furthermore, as the wafer is rotated, a centrifugal force C is imparted to the electroless deposition solution 810. These forces serve to impel the electroless deposition solution to flow from the inner border of the edge exclusion region to the wafer's edge and eventually off the wafer. It will be appreciated that the factors discussed herein (including flow velocity, flow direction, flow dispersion, and rotation speed of the wafer) can be adjusted to provide for a substantially even distribution of the electroless deposition solution on the wafer surface, that is, wherein the flow of the electroless deposition solution over the wafer surface exhibits a substantially even layer thickness, with the exception of the inner border of the electroless deposition solution and the outer edge at which the solution escapes from the wafer surface.

Figure 9:
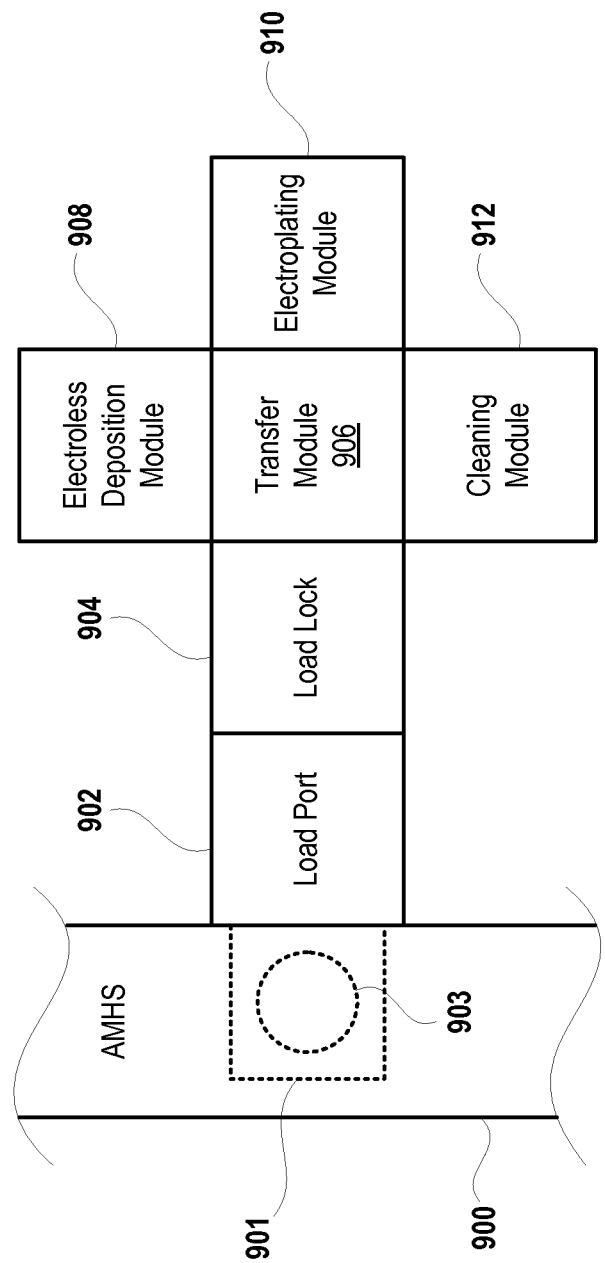
FIG. 9 illustrates a system for processing a wafer, in accordance with an embodiment of the invention.

FIG. 9 illustrates a system for processing a wafer, in accordance with an embodiment of the invention. An automated material handling system (AMHS) 900 provides for transport and stocking of wafer carriers such as front opening unified pods (FOUP's). The AMHS 900 transports a wafer carrier 901 to a load port 902. The load port 902 engages the wafer carrier 901, opening the wafer carrier 901 to gain access to wafers that are transported within the wafer carrier 901. The load port 902 unloads wafers from the wafer carrier 901 for processing in the system, and loads the wafers into the wafer carrier 901 after processing of the wafers in the system is completed. A load lock 904 is coupled to the load port 902, and also coupled to a transfer module 906. The load lock serves to isolate the process operation hardware, which can include an electroless deposition module 908, an electroplating module 910, and a cleaning module 912 that are each coupled to the transfer module 906. It will be appreciated that the transfer module 906, the electroless deposition module 908, the electroplating module 910, and the cleaning module 912, may be maintained under controlled atmospheric conditions, including controlled gas environment compositions, controlled pressures, and controlled temperatures. The load lock 904 functions to preserve such controlled atmospheric conditions in the processing portion of the system, and prevent contamination from exposure to external conditions.

In some embodiments, the wafer carrier 901 may itself be configured to be airtight and maintain an internal controlled environmental condition that is similar to or matching that of the processing portion of the system. Therefore, in an alternative configuration, the load lock 904 is not present, and the load port 902 is instead coupled directly to the transfer module 906.

A processing procedure for a given wafer 903 will now be described. The wafer 903 is transported in the carrier 901 by the AMHS 900 to the load port 902. The load port 902 engages the carrier 901, and unloads the wafer 903 and moves the wafer 903 into the load lock 904. The transfer module 906 retrieves the wafer 903 from the load lock 904, and moves the wafer 903 into the electroless deposition module 908. In the electroless deposition module 908, and electroless deposition operation is performed on the wafer 903, wherein a metallic material is selectively deposited at the edge exclusion region of the wafer 903, thereby forming an edge metallization layer over the wafer surface at the edge exclusion region.

After the electroless deposition is performed, the wafer 903 is returned to the transfer module 906, and moved to the electroplating module 910. in the electroplating module 910, an electroplating process is performed on the wafer. The electroplating process includes contacting the edge metallization layer with electrical contacts and applying a current to the wafer 903 via the electrical contacts. During the electroplating process, the applied current can be increased to provide for increased deposition rates, this being facilitated by the edge metallization layer which has effectively increased the conductance of the edge exclusion region of the wafer.

After the electroplating is completed, the wafer 903 is returned to the transfer module 906, and optionally transferred to a cleaning module 912, in which a post-deposition cleaning procedure is performed. By way of example, the cleaning module 912 may define a brush-box or other cleaning mechanism for removing residual artifacts or contaminants from the wafer surface following electroplating. After cleaning is completed, the wafer 903 is returned to the transfer module 906, which in turn moves the wafer 903 into the load lock 904. From the load lock 904, the wafer 903 is returned to the load port 902, and from the load port 902 the wafer 903 is returned to the wafer carrier 901.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for electroplating a substrate, comprising,
   providing a substrate having a conductive layer disposed on a top surface of the substrate, the top surface of the substrate having an edge exclusion region defined as an annular area that extends to an edge of the substrate, the top surface of the substrate further having a process region defined as a central area of the substrate that extends to about the annular area;
   directing a flow of an electroless deposition solution toward the edge exclusion region while the substrate is rotated, the flow being directed away from the process region, such that the electroless deposition solution is substantially directed over the annular area of the edge exclusion region, the electroless deposition solution plates metallic material over the conductive layer at the edge exclusion region;
   continuing the flow of the electroless deposition solution for a period of time, the period of time being predefined to produce an increased thickness of the metallic material at the edge exclusion region, wherein the increased thickness of the metallic material reduces electrical resistance of the metallic material at the edge exclusion region;
   applying electrical contacts over the metallic material, the electrical contacts being distributed around the annular area of the edge exclusion region; and
   applying electrical current to the metallic material via the electrical contacts while an electroplating solution is applied over the process region of the substrate, the increased thickness and resulting reduced electrical resistance for the electrical current facilitates increasing a rate at which the process region is plated as a result of the applied electrical current and the applied electroplating solution.

2. The method of claim 1,
   wherein the conductive layer defines a metallic seed layer; and
   wherein applying electrical current to the metallic material via the electrical contacts effects plating of a metallic bulk layer over the process region of the substrate.

3. The method of claim 1, wherein the conductive layer is defined by a metal selected from the group consisting of copper, cobalt, ruthenium, or gold.

4. The method of claim 1, wherein the metallic material is defined by a metal selected from the group consisting of copper, cobalt, ruthenium, or gold.

5. The method of claim 1, wherein a thickness of the conductive layer is in the range of about 10 to 200 angstroms.

6. The method of claim 1, wherein increasing the rate at which the process region is plated is defined by increasing the applied electrical current while the electroplating solution is applied over the process region of the substrate, the increased thickness of the metallic material and resulting reduced electrical resistance facilitating increasing the applied electrical current.

7. The method of claim 1, wherein the rate at which the process region is plated increases from an initial rate to an increased rate that is approximately linearly correlated to the increased thickness of the metallic material.

8. The method of claim 1,
   wherein the conductive layer defines a liner layer or a barrier layer; and
   wherein applying electrical current to the metallic material via the electrical contacts effects plating of a metallic seed layer or a metallic bulk layer over the process region of the substrate.

9. A method for processing a substrate, comprising:
   receiving a substrate having a metallic seed layer;
   applying an electroless deposition solution to a first portion of the metallic seed layer, defined at an edge exclusion region of the substrate, to selectively deposit an edge metallization layer over the first portion of the metallic seed layer;
   applying electrical contacts to the edge metallization layer;
   exposing a second portion of the metallic seed layer, defined at a device region of the substrate, to an electroplating solution;
   applying a current to the electrical contacts, to electroplate a metallic bulk layer over the second portion of the metallic seed layer.

10. The method of claim 9, wherein applying the electroless deposition solution includes directing a nozzle towards a peripheral location of the substrate in the edge exclusion region, rotating the substrate, and dispensing the electroless deposition solution from the nozzle as the substrate is rotated.

11. The method of claim 9, wherein a thickness of the edge metallization layer is defined by a duration of the application of the electroless deposition solution to the first portion of the metallic seed layer.

12. The method of claim 11, wherein the duration is predefined to increase the thickness of the edge metallization layer and thereby reduce resistance when the current is applied via the electrical contacts.

13. The method of claim 9, wherein the edge metallization layer provides for an increased conductance of the substrate in the edge exclusion region to accommodate an increased current from the electrical contacts.

14. The method of claim 9, wherein the metallic seed layer and the edge metallization layer are defined by a same metal, such that depositing the edge metallization layer thickens the seed layer in the edge exclusion region.

15. The method of claim 9, wherein the metallic seed layer is defined by a metal selected from the group consisting of copper, cobalt, ruthenium, or gold.

16. The method of claim 9, wherein the edge metallization layer is defined by a metal selected from the group consisting of copper, cobalt, ruthenium, or gold.

17. The method of claim 9, wherein the edge metallization layer has a thickness in the range of approximately 50 to 200 angstroms.

18. The method of claim 9, wherein applying the current includes increasing a level of the current as the metallic bulk layer is deposited, to increase a rate of deposition of the metallic bulk layer.

19. The method of claim 9, further comprising, preventing exposure of the electrical contacts and the edge exclusion region to the electroplating solution.

\* \* \* \* \*